US012813098B2

(12) United States Patent
Kum

(10) Patent No.: US 12,813,098 B2
(45) Date of Patent: Nov. 24, 2026

(54) DISPLAY APPARATUS AND METHOD OF MANUFACTURING THE DISPLAY APPARATUS

(71) Applicant: Samsung Display Co., Ltd., Yongin-Si (KR)

(72) Inventor: Kyobum Kum, Yongin-si (KR)

(73) Assignee: Samsung Display Co., Ltd., Yongin-si (KR)

(*) Notice: Subject to any disclaimer, the term of this patent is extended or adjusted under 35 U.S.C. 154(b) by 353 days.

(21) Appl. No.: 18/427,901

(22) Filed: Jan. 31, 2024

(65) Prior Publication Data

US 2024/0324331 A1 Sep. 26, 2024

(30) Foreign Application Priority Data

Mar. 24, 2023 (KR) ........................ 10-2023-0039019
Jul. 24, 2023 (KR) ........................ 10-2023-0096414

(51) Int. Cl.
*H10K 59/127* (2023.01)
*H10K 59/12* (2023.01)
*H10K 59/126* (2023.01)
*H10K 59/88* (2023.01)

(52) U.S. Cl.
CPC ..... *H10K 59/1275* (2023.02); *H10K 59/1201* (2023.02); *H10K 59/126* (2023.02); *H10K 59/88* (2023.02)

(58) Field of Classification Search
CPC ........... H10K 59/1275; H10K 59/1201; H10K 59/126; H10K 59/88
See application file for complete search history.

(56) References Cited

U.S. PATENT DOCUMENTS

| | | | | |
|---|---|---|---|---|
| 6,881,894 | B2 | 4/2005 | Kai | |
| 10,548,225 | B2 | 1/2020 | Lee et al. | |
| 11,756,895 | B2 | 9/2023 | Kim et al. | |
| 2007/0109470 | A1* | 5/2007 | Hosoya | G02F 1/1333 349/110 |
| 2020/0271979 | A1* | 8/2020 | Roh | G02F 1/13452 |
| 2021/0351262 | A1* | 11/2021 | Kim | H05K 1/0269 |
| 2022/0085120 | A1* | 3/2022 | Lee | H05K 1/111 |
| 2022/0393119 | A1* | 12/2022 | Aota | G09F 9/30 |
| 2023/0143214 | A1* | 5/2023 | Song | G02F 1/133314 257/40 |
| 2023/0247852 | A1* | 8/2023 | Kim | H05K 1/0218 257/40 |

(Continued)

FOREIGN PATENT DOCUMENTS

| | | | |
|---|---|---|---|
| KR | 10-0457456 | B1 | 11/2004 |
| KR | 10-1057354 | B1 | 8/2011 |

(Continued)

*Primary Examiner* — Victor A Mandala
(74) *Attorney, Agent, or Firm* — Innovation Counsel LLP

(57) ABSTRACT

Provided are a display apparatus and a method of manufacturing the display device. According to an embodiment, the display apparatus includes a display panel including a plurality of pixels, a display circuit board configured to deliver signals to the display panel, a plurality of markers disposed on the display circuit board, and a shielding film arranged to cover at least one of the plurality of markers and including an opening pattern, wherein the shielding pattern overlaps a portion of the marker in a plan view.

20 Claims, 9 Drawing Sheets

(56) References Cited

U.S. PATENT DOCUMENTS

| | | | | |
|---|---|---|---|---|
| 2023/0269978 | A1* | 8/2023 | Shin | H05K 1/118 257/40 |
| 2024/0334776 | A1* | 10/2024 | Tang | H10K 59/40 |

FOREIGN PATENT DOCUMENTS

| | | | |
|---|---|---|---|
| KR | 10-2018-0025350 | A | 3/2018 |
| KR | 10-2021-0022815 | A | 3/2021 |

* cited by examiner

DISPLAY APPARATUS AND METHOD OF MANUFACTURING THE DISPLAY APPARATUS

CROSS-REFERENCE TO RELATED APPLICATIONS

This application is based on and claims priority under 35 U.S.C. § 119 to Korean Patent Application Nos. 10-2023-0039019, filed on Mar. 24, 2023, and 10-2023-0096414, filed on Jul. 24, 2023, in the Korean Intellectual Property Office, the disclosures of which are incorporated by reference herein in their entireties.

BACKGROUND

1. Field

One or more embodiments relate to a display apparatus and a method of manufacturing the display apparatus, and, more particularly, to a display apparatus in which a process of manufacturing a display circuit board may be further simplified, and a method of manufacturing the display apparatus.

2. Description of the Related Art

Recently, electronic devices have been widely used. Electronic devices are used in a variety of forms, e.g., mobile electronic devices or immobile electronic devices, and include display devices configured to provide visual information such as images and videos to users to support various functions.

Due to the miniaturization of other components configured to drive display apparatuses, the importance of display apparatuses in electronic devices has gradually increased, and a structure bendable from a flat state to a certain degree has been developed.

Generally, a display apparatus has a display layer disposed on a substrate. By bending, at least a portion of the display apparatus, visibility from various angles may be improved or a non-display area may be reduced. More particularly, components such as a display circuit board may be arranged in a portion of the bent display apparatus.

The aforementioned background art may include technical information possessed by the inventors for deriving the embodiments or obtained in a process of deriving the embodiments, and may not necessarily include well-known technologies disclosed to the public before the filing of the embodiments.

SUMMARY

An alignment pattern for alignment, a character for providing particular information, and the like are printed on a display circuit board, and there may be a need for simplification of processes.

One or more embodiments include a display apparatus in which a process of manufacturing the display circuit board may be further simplified and a method of manufacturing the display apparatus.

However, the technical goal is only illustrative, and technical goals of the embodiments are not limited thereto.

Additional aspects will be set forth in part in the description which follows and, in part, will be apparent from the description, or may be learned by practice of the presented embodiments of the disclosure.

According to one or more embodiments, a display apparatus includes a display panel including a plurality of pixels, a display circuit board configured to deliver signals to the display panel attached to the display panel. The display circuit board may include a plurality of markers disposed on the display circuit board, and a shielding film arranged on the plurality of markers to cover at least one of the plurality of markers and comprising at least one opening pattern exposing the at least one of the plurality of markers in a plan view.

In an embodiment, the at least one of the plurality of markers exposed by the at least one opening pattern may be visibly exposed through the at least one opening pattern.

In an embodiment, the display circuit board may include a film layer, a first conductive layer disposed on one surface of the film layer, and a second conductive layer disposed on the other surface of the film layer opposite to the one surface of the film layer, and the first conductive layer and the second conductive layer may be electrically connected to each other through a conductor arranged in a through hole formed through the first conductive layer, the second conductive layer, and the film layer.

In an embodiment, the plurality of markers may include a first marker disposed on the through hole to cover the through hole in a plan view and covered by the shielding film.

In an embodiment, the first marker may completely cover the through hole in a plan view.

In an embodiment, the plurality of markers may further include a second marker which is not covered by the shielding film.

In an embodiment, the at least one of the plurality of markers exposed by the at least one opening pattern may form an alignment mark of the display circuit board.

In an embodiment, the plurality of markers may further include a third marker arranged to completely overlap the opening pattern in a plan view.

In an embodiment, the first marker, the second marker, and the third marker may be disposed on a same layer.

In an embodiment, the first marker, the second marker, and the third marker may include a same material.

In an embodiment, the first marker and the third marker may be integrally formed to be a single piece.

In an embodiment, the opening pattern may have an alignment mark shape.

In an embodiment, the shielding film may include a black dye, and the at least one of the plurality of markers may include a white dye.

According to one or more embodiments, a method of manufacturing the display apparatus includes preparing a display circuit board configured to deliver signals to a display panel, forming a plurality of markers on the display circuit board, preparing a shielding film having an opening pattern formed through the shielding film, and arranging the shielding film to cover at least one of the plurality of markers for the opening pattern to expose the at least one of the plurality of markers in a plan view.

In an embodiment, the plurality of markers may be formed through a silk screen printing method.

In an embodiment, the opening pattern may have an alignment mark shape.

In an embodiment, the display circuit board may include a film layer, a first conductive layer disposed on one surface of the film layer, and a second conductive layer disposed on the other surface of the film layer opposite to the one surface of the film layer, and the first conductive layer and the second conductive layer may be electrically connected to each other through a conductor arranged in a through hole formed through the first conductive hole, the second conductive hole, and the film layer.

In an embodiment the plurality of markers include the first marker disposed on the through hole to cover the through hole and covered by the shielding film.

In an embodiment, the first marker may completely cover the through hole in a plan view.

In an embodiment, the shielding film may include a black dye, and the plurality of markers may include a white dye.

Other aspects, features, and advantageous effects will be clearly understood from detailed description, claims, and the accompanying drawings.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
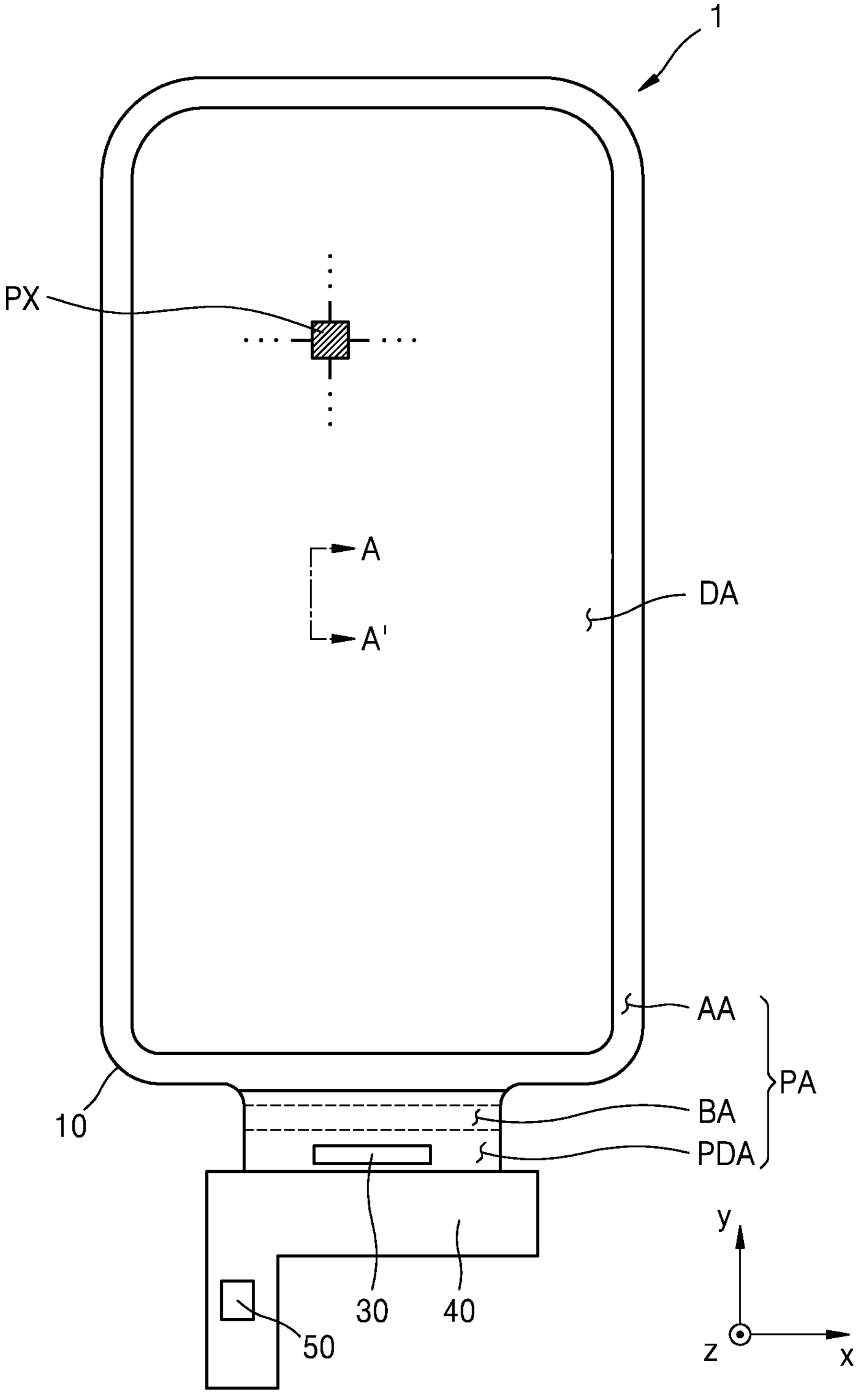
FIG. 1 is a plan view schematically illustrating a portion of a display apparatus according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As used herein, the terms 'first' and 'second' are only used to distinguish one element from others, and are not used in a limited sense.

As used herein, the singular forms are intended to encompass the plural forms as well, unless the context clearly indicates otherwise.

It will be further understood that the terms "comprise," "comprising," "include," "including," "have," "having," and the like, when used herein, specify the presence of stated features and/or elements, but do not preclude the presence or addition of one or more other features and/or elements.

In the following embodiments, when a portion such as a film, an area, or a component is on or above another portion, the portion may be directly on the other portion, or other films, areas, or components may be located therebetween.

In the drawings, the sizes of elements may be exaggerated or reduced for convenience. For example, since the size and thickness of each element is arbitrarily shown in the drawings for convenience of description, the disclosure is not necessarily limited to those illustrated.

When some embodiments may be differently implemented, a particular process sequence may be performed differently from a sequence described. For example, two processes described in succession may be performed substantially simultaneously, or may be performed in an order opposite to an order described.

In the present specification, when it is referred that a film, an area, and a component are connected to another film, area, and component, the film, area, and component may be directly connected to the other film, area, and component, or may be indirectly connected with another film, area, and component therebetween. For example, when it is referred that a film, an area, and a component are electrically connected to another film, area, and component, the film, area, and component may be directly in electric connection with the other film, area, and component, or may be indirectly in electric connection with the other film, area, and component with another film, area, and component therebetween.

An x-axis, a y-axis, and a z-axis are not limited to three axes on an orthogonal coordinate system, and may be interpreted as a wide meaning including the same. For example, the x-axis, y-axis, and z-axis may be orthogonal to one another, but may also refer to different directions that are not orthogonal to one another.

Figure 2:
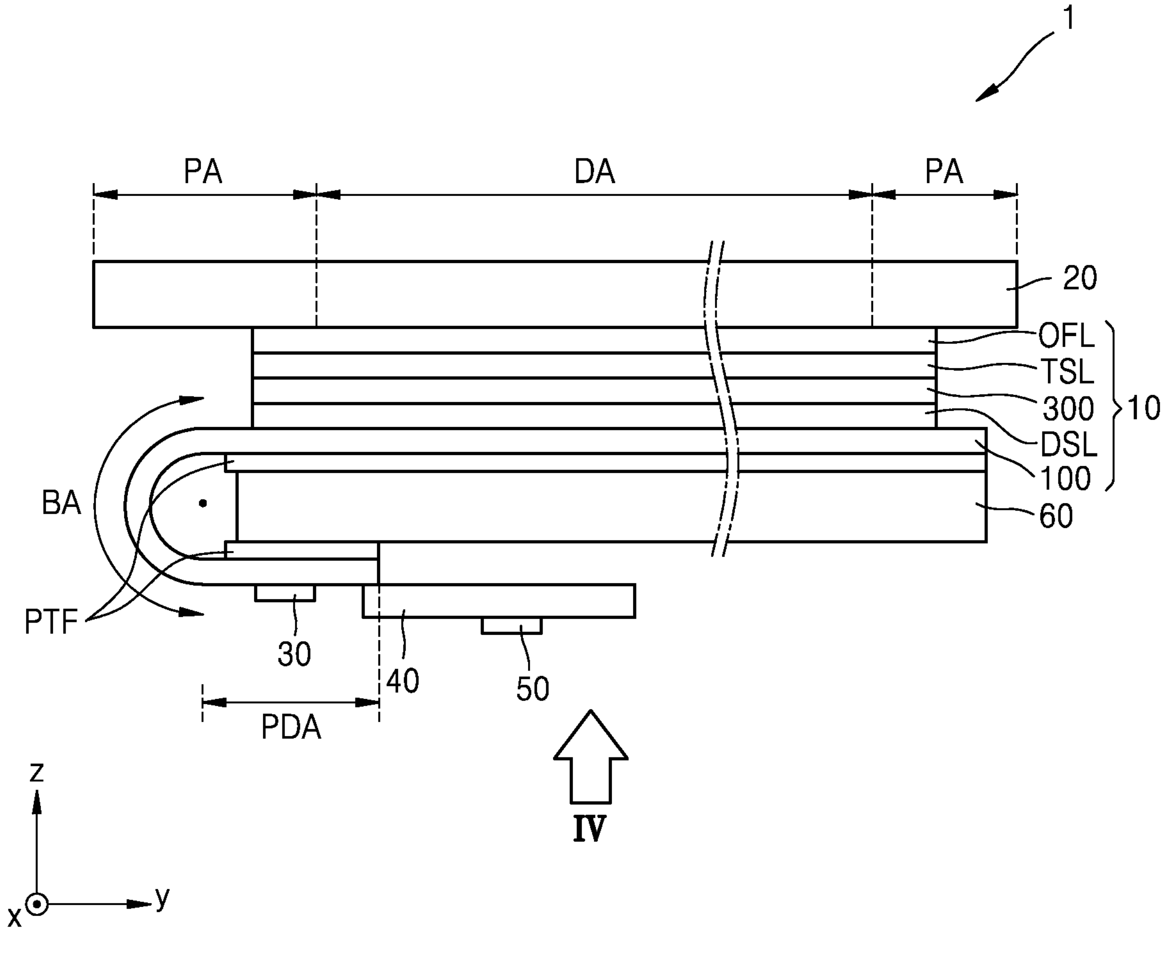
FIG. 2 is a side view schematically illustrating a display apparatus including components shown in FIG. 1.

FIG. 1 is a top-plan view schematically illustrating a portion of a display apparatus 1 according to an embodiment; and FIG. 2 is a lateral view schematically illustrating the display apparatus 1 including components shown in FIG. 1. FIG. 2 illustrates that a substrate 100 is flexible and thus a display panel 10 has a bent shape in a bending area BA. For convenience, FIG. 1 illustrates a case in which the display panel 10 is not bent.

Referring to FIG. 1, the display apparatus 1, which is an apparatus configured to display videos or still images, may be used as a display screen of various products such as televisions, notebook computers, monitors, billboard charts, Internet of Things (IoT) devices as well as portable electronic devices such as mobile phones, smartphones, tablet personal computers (tablet PCs), mobile communication terminals, personal digital assistants (PDAs), electronic books, portable multimedia players (PMPs), navigation systems, and ultra mobile PCs. In addition, the display apparatus 1 according to an embodiment may also be used for wearable devices, e.g., smart watches, watch phones, and head mounted displays (HMDs). The display apparatus 1 according to an embodiment may also be used for dashboards of automobiles, center information displays (CIDs) on center fasciae or dashboards of automobiles, room mirror displays replacing side mirrors of automobiles, and display screens on rear sides of front seats to serve as an entertainment devices for backseat passengers of automobiles.

As shown in FIG. 1, the display apparatus 1 may have an approximately rectangular shape. For example, the display apparatus 1 may have a flat surface that is generally rectangular which has a short side extending in a first direction (e.g., an x direction or −x direction) and a long side extending in a second direction (e.g., a y direction or the −y direction). In an embodiment, a portion at which the short side extending in the first direction (e.g., the x direction or the −x direction) meets the long side extending in the second direction (e.g., the y direction or the −y direction) may have a right-angle shape or a rounded shape with a certain curvature. However, the shape of the flat surface of the display apparatus 1 is not limited to a rectangle and may have other polygon shapes, a circular shape, or an oval shape.

The display apparatus 1 may include a display area DA and a peripheral area PA. The display area DA may be configured to display images. In this case, pixels PX may be arranged in the display area DA. The display apparatus 1 may be configured to provide images using light emitted from the pixels PX. Each of the pixels PX may be configured to emit light using a display element. In an embodiment, each of the pixels PX may be configured to emit red, green, or blue light. In an embodiment, each of the pixels PX may be configured to emit red, green, blue, or white light.

The peripheral area PA, in which images are not provided, may include a non-display area. The peripheral area PA may at least partially surround the display area DA. For example, the peripheral area PA may entirely surround the display area DA. A driver configured to provide electric signals to the pixels PX or power wirings configured to provide power may be arranged in the peripheral area PA. For example, a scan driver configured to apply a scan signal to the pixels PX may be arranged in the peripheral area PA. In addition, a data driver configured to apply a data signal to the pixels PX may be arranged in the peripheral area PA.

Referring to FIG. 2, the display apparatus 1 may include the display panel 10, a cover window 20, a display driver 30, a display circuit board 40, a touch sensor driver 50, a cushion layer 60, and a protective film PTF.

The display panel 10 may be configured to display information processed by the display apparatus 1. For example, the display panel 10 may be configured to display an execution screen information of an application driven by the display apparatus 1 or information regarding user interface (UI) and graphic user interface (GUI) according to the execution screen information.

The display panel 10 may include display elements. For example, the display panel 10 may include an organic light-emitting display panel in which an organic light-emitting diode is used, a micro light-emitting diode display panel in which a micro LED is used, a quantum-dot light-emitting display panel in which a quantum-dot light-emitting diode including a quantum-dot emission layer is used, and an inorganic light-emitting display panel in which an inorganic light-emitting device including an inorganic semiconductor is used. Hereinafter, a case in which the display panel 10 includes an organic light-emitting display panel using an organic light-emitting diode as the display element will be mainly described in detail.

The display panel 10 may include a substrate 100 and a multi-layer film disposed on the substrate 100. In an embodiment, the display panel 10 may include the substrate 100, a display layer DSL, an encapsulation layer 300, a touch sensor layer TSL, and an optical function layer OFL. In this case, the display area DA and the peripheral area PA may be defined in the substrate 100 and/or the multi-layer film. For example, the substrate 100 may include the display area DA and the peripheral area PA. In addition, the peripheral area PA may include an adjacent area AA, a pad area PDA, and a bending area BA.

The substrate 100 may include a polymer resin such as polyethersulfone, polyarylate, polyetherimide, polyethylene naphthalate, polyethylene terephthalate, polyphenylene sulfide, polyimide, polycarbonate, cellulose triacetate, cellulose acetate propionate, and the like. In an embodiment, the substrate 100 may have a multi-layer structure including a base layer and a barrier layer (not shown), wherein the base layer may include the aforementioned polymer resin. The substrate 100 including the polymer resin may be flexible, rollable, and bendable.

The substrate 100 may be bent in the bending area BA. In this case, at least some portions of a bottom surface of the substrate 100 may face each other, for example, a bottom surface of the pad area PDA which is disposed at a lower position than other portions of the substrate 100 may face the bottom surface of the substrate 100. Accordingly, an area of the peripheral area PA identified by the user may be reduced. Although FIG. 2 illustrates that only the substrate 100 is bent, in other embodiments, at least a portion of the display layer DSL, at least a portion of the encapsulation layer 300, and at least a portion of the touch sensor layer TSL may also be in the bending area BA and the pad area PDA. In this case, at least the portion of the display layer DSL, at least the portion of the encapsulation layer 300, and at least the portion of the touch sensor layer TSL may also be bent in the bending area BA.

The display layer DSL may be disposed on the substrate 100. The display layer DSL may include pixel circuits and display elements. Here, the pixel circuits may be respectively connected to the display elements. The pixel circuit may include at least one thin-film transistor and a storage capacitor. Accordingly, the display layer DSL may include a plurality of display elements, a plurality of thin-film transistors, and storage capacitors. In addition, the display layer DSL may further include insulating layers interposed between adjacent conductive layers.

The encapsulation layer 300 may be disposed on the display layer DSL. The encapsulation layer 300 may be disposed on the display elements and cover the display elements. In an embodiment, the encapsulation layer 300 may include at least one inorganic encapsulation layer and at least one organic encapsulation layer. The at least one inorganic encapsulation layer may include one or other inorganic materials from among aluminum oxide ($Al_2O_3$), titanium oxide ($TiO_2$), tantalum oxide ($Ta_2O_5$), zinc oxide (ZnO), silicon oxide ($SiO_2$), silicon nitride ($SiN_x$), and silicon oxynitride. The at least one organic encapsulation layer may include a polymer-based material. The polymer-based material may include an acryl-based resin, an epoxy-based resin, polyimide, polyethylene, and the like. In an embodiment, the at least one organic encapsulation layer may include acrylate.

The touch sensor layer TSL may be disposed on the encapsulation layer 300. The touch sensor layer TSL may be configured to sense coordinate information according to an external input, e.g., a touch event. The touch sensor layer TSL may include a sensor electrode and touch wirings connected to the sensor electrode. The touch sensor layer TSL may be configured to sense external inputs in a self-capacitance method or a mutual capacitance method.

The touch sensor layer TSL may be formed on the encapsulation layer 300. Alternatively, the touch sensor layer TSL may be separately formed on a touch substrate and then may be combined to the encapsulation layer 300 through an adhesive layer such as an optical clear adhesive. In an embodiment, the touch sensor layer TSL may be formed directly on the encapsulation layer 300, and in this case, the adhesive layer may not be disposed between the touch sensor layer TSL and the encapsulation layer 300.

The optical function layer OFL may be disposed on the touch sensor layer TSL. The optical function layer OFL may be configured to reduce a reflectance of light (external light) incident from outside to the display apparatus 1 and/or improve color purity of light emitted from the display apparatus 1. In an embodiment, the optical function layer OFL may include a retarder and a polarizer. The retarder may include a film type or a liquid-crystal type, and may include a λ/2 retarder and/or a λ/4 retarder. The polarizer may also include a film type or a liquid-crystal coating type. The film type polarizer may include a stretchable synthetic resin film, and the liquid-crystal coating type polarizer may include liquid crystals arranged in a certain arrangement. The retarder and the polarizer may further include a protective film.

In another embodiment, the optical function layer OFL may include a black matrix and color filters. The color filters may be arranged in consideration of colors of light emitted from the pixels of the display apparatus 1. Each of the color filters may include a pigment or a dye of red, green, or blue color. Alternatively, each of the color filters may further include quantum dots in addition to the pigment or dye. Alternatively, some of the color filters may not include the pigment or dye and include scattering particles such as titanium oxide.

In another embodiment, the optical function layer OFL may include a destructive interference structure. The destructive interference structure may include a first reflective layer and a second reflective layer respectively disposed on different layers. First reflected light and second reflective light respectively reflected from the first reflective layer and the second reflective layer may undergo destructive interference, and accordingly, reflectance of external light may be reduced.

The cover window 20 may be disposed on the display panel 10. The cover window 20 may protect the display panel 10. In an embodiment, the cover window 20 may include a flexible window. The cover window 20 may be easily bent under external forces and protect the display panel 10, without occurrence of cracks and the like. The cover window 20 may include at least one of glass, sapphire, and plastic. The cover window 20 may include, for example, ultra-thin glass and colorless polyimide (CPI). In an embodiment, the cover window 20 may have a structure in which a flexible polymer layer is arranged on a surface of a glass substrate, or may include a polymer layer.

The cover window 20 may be attached to the display panel 10 through the adhesion member. The adhesion member may include a transparent adhesion member, e.g., an optically clear adhesive (OCA) film. In addition, the adhesion member may include various adhesive materials known in the art. Such adhesion member may be formed on the display panel 10 through various methods, for example, may be a film type which may be attached onto the display panel 10 or a liquid type which may be coated on the display panel 10.

The display driver 30 may be arranged in the pad area PDA. The display driver 30 may be configured to receive control signals and power voltages, and may also be configured to generate and output signals and voltages for driving the display panel 10. The display driver 30 may include an integrated circuit (IC).

The display circuit board 40 may be electrically connected to the display panel 10. For example, the display circuit board 40 may be electrically connected to the pad area PDA of the substrate 100 through an anisotropic conductive film.

The display circuit board 40 may include a flexible printed circuit board (FPCB) that is bendable or a rigid printed circuit board (PCB) that is rigid and is not easily bent. Alternatively, according to occasions, the display circuit board 40 may include a complex printed circuit board including both of the FPCB and the PCB.

The touch sensor driver 50 may be disposed on the display circuit board 40. The touch sensor driver 50 may include an integrated circuit. The touch sensor driver 50 may be attached onto the display circuit board 40. The touch sensor driver 50 may be electrically connected to sensor electrodes of the touch sensor layer TSL of the display panel 10 through the display circuit board 40.

In addition, a power supply unit (not shown) may be additionally disposed on the display circuit board 40. The power supply unit may be configured to provide a driving voltage for driving the pixels of the display panel 10 and the display driver 30.

The protective film PTF may be patterned and attached to the bottom surface of the substrate 100. In this case, the protective film PTF may be attached to a portion of the substrate 100 except the bending area BA. That is, the protective film PTF may be attached on a surface of the substrate 100 that is opposite to a surface on which the display layer DSL is disposed.

In an embodiment, the cushion layer 60 may be disposed under the display panel 10, more particularly, at a bottom portion of the substrate 100. In addition, as the substrate 100 is bent and portions of the substrate 100 are arranged to face each other, the cushion layer 60 may be arranged between the portions of the bottom surface 100 of the substrate 100 facing each other. The cushion layer 60 may be configured to absorb external impacts and prevent breakage of the display panel 10. The cushion layer 60 may include a polymer resin such as polyurethane, polycarbonate, polypropylene, polyethylene, and the like, or an elastic material such as rubber and a sponge obtained through foaming plastic on a urethane-based material or an acryl-based material.

Figure 3:
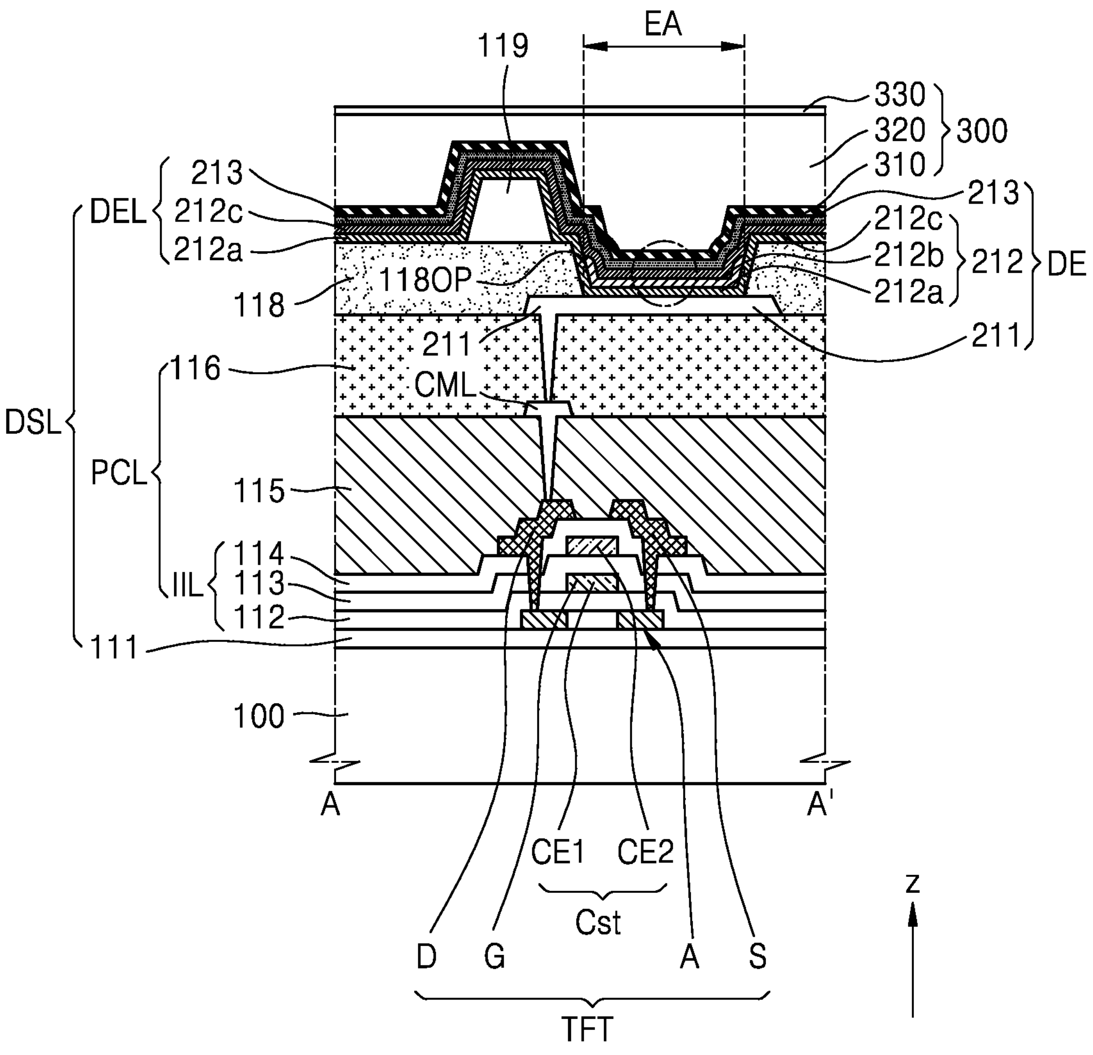
FIG. 3 is a cross-sectional view schematically illustrating a cross-section of a display panel, taken along a line A-A' shown in FIG. 1.

FIG. 3 is a cross-sectional view schematically illustrating a cross-section of the display panel 10 taken along a line A-A' shown in FIG. 1.

Referring to FIG. 3, the display panel 10 may include the substrate 100, the display layer DSL, the encapsulation layer 300, the touch sensor layer TSL, and the optical function layer OFL.

For convenience of explanation, the touch sensor layer TSL and the optical function layer OFL are omitted in FIG. 3.

The display layer DSL may be disposed on the substrate 100. The display layer DSL may include a buffer layer 111, a pixel circuit layer PCL, and a display element layer DEL.

The substrate 100 may include glass or a polymer material such as polyethersulfone, polyarylate, polyetherimide, polyethylene naphthalate, polyethylene terephthalate, polyphenylene sulfide, polyimide, polycarbonate, cellulose triacetate, cellulose acetate propionate, and the like. The substrate 100 including the polymer resin may be flexible, rollable, and bendable. The substrate 100 may have a multi-layer structure including the base layer and the barrier layer (not shown), wherein the base layer may include the aforementioned polymer resin.

The buffer layer 111 may include an inorganic insulating material such as silicon nitride, silicon oxynitride, and silicon oxide, and may include a single layer or multiple layers including the aforementioned inorganic insulating material.

The pixel circuit layer PCL may be disposed on the buffer layer 111. The pixel circuit layer PCL may include a transistor TFT included in the pixel circuit and an inorganic insulating layer IIL, a first planarization layer 115, and a second planarization layer 116 disposed on components of the transistor TFT. The inorganic insulating layer IIL may include a first gate insulating layer 112, a second gate insulating layer 113, and an interlayer insulating layer 114.

The transistor TFT may include a semiconductor layer A, and the semiconductor layer A may include polysilicon. Alternatively, the semiconductor layer A may include amorphous silicon, an oxide semiconductor, or an organic semiconductor. The semiconductor layer A may include a channel area; and a drain area and a source area respectively arranged at two sides of the channel area. A gate electrode G may overlap the channel area.

The gate electrode G may include a low-resistance metal material. The gate electrode G may include a conductive material including molybdenum (Mo), aluminum (Al), copper (Cu), titanium (Ti), and the like, and may include multiple layers or a single layer including the aforementioned materials.

The first gate insulating layer 112 disposed between the semiconductor layer A and the gate electrode G may include an inorganic insulating material such as $SiO_2$, $SiN_x$, SiON, $Al_2O_3$, $TiO_2$, $Ta_2O_5$, hafnium oxide ($HfO_2$), or zinc oxide ($ZnO_x$). The zinc oxide ($ZnO_x$) may include zinc oxide (ZnO) and/or zinc peroxide ($ZnO_2$).

The second gate insulating layer 113 may be provided to cover the gate electrode G. Similar to the first gate insulating layer 112, the second gate insulating layer 113 may include $SiO_2$, $SiN_x$, SiON, $Al_2O_3$, $TiO_2$, $Ta_2O_5$, $HfO_2$, or $ZnO_x$. The zinc oxide ($ZnO_x$) may include zinc oxide (ZnO) and/or zinc peroxide ($ZnO_2$).

An upper electrode CE2 of the storage capacitor Cst may be disposed on the second gate insulating layer 113. The upper electrode CE2 may overlap the gate electrode G disposed thereunder. In this case, the gate electrode G and the upper electrode CE2 overlapping each other with the second gate insulating layer 113 disposed therebetween may form the storage capacitor Cst of the pixel circuit. That is, the gate electrode G may function as a lower electrode CE1 of the storage capacitor Cst. Like this, the storage capacitor Cst and the transistor TFT may overlap each other. In some embodiments, the storage capacitor Cst may not overlap the transistor TFT.

The upper electrode CE2 may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and/or copper (Cu), and may include a single layer or multiple layers including the aforementioned materials.

The interlayer insulating layer 114 may cover the upper electrode CE2. The interlayer insulating layer 114 may include $SiO_2$, $SiN_x$, SiON, $Al_2O_3$, $TiO_2$, $Ta_2O_5$, $HfO_2$, $ZnO_x$, or the like. The zinc oxide ($ZnO_x$) may include zinc oxide (ZnO) and/or zinc peroxide ($ZnO_2$). The interlayer insulating layer 114 may include a single layer or multiple layers including the aforementioned inorganic insulating materials.

The drain electrode D and the source electrode S may each be on the interlayer insulating layer 114. The drain electrode D and the source electrode S may each include a highly conductive material. The drain electrode D and the source electrode S may include a conductive material including Mo, Al, Cu, Ti, and the like, and may include multiple layers or a single layer including the aforementioned materials. In an embodiment, the drain electrode D and the source electrode S may each have a multi-layered structure including TI/Al/Ti.

The first planarization layer 115 may be arranged to cover the drain electrode D and the source electrode S. The first planarization layer 115 may include an organic insulating layer. The first planarization layer 115 may include an organic insulating material, e.g., a general-purpose polymer such as polymethylmethacrylate (PMMA) or polystyrene (PS), a polymer derivative having a phenol-based group, an acryl-based polymer, an imide-based polymer, an arylether-based polymer, an amide-based polymer, a fluoride-based polymer, a p-xylene based polymer, a vinylalcohol-based polymer, and blends thereof.

A connection electrode CML may be disposed on the first planarization layer 115. In this case, the connection electrode CML may be connected to the drain electrode D or the source electrode S through a contact hole in the first planarization layer 115. The connection electrode CML may include a highly conductive material. The connection electrode CML may include a conductive material including Mo, Al, Cu, TI, and the like, and may include multiple layers or a single layer including the aforementioned materials. In an embodiment, the connection electrode CML may include a multi-layered structure including Ti/Al/Ti.

The second planarization layer 116 may be arranged to cover the connection electrode CML. The second planarization layer 116 may include an organic insulating layer. The second planarization layer 116 may include an organic insulating material, e.g., a general-purpose polymer such as PMMA or PS, a polymer derivative having a phenol-based group, an acryl-based polymer, an imide-based polymer, an arylether-based polymer, an acryl-based polymer, a fluoride-based polymer, a p-xylene based polymer, a vinylalcohol-based polymer, and blends thereof. The display element layer DEL may be disposed on the pixel circuit layer PCL. The display element layer DEL may include a display element DE. The display element DE may include an organic light-emitting diode OLED. A pixel electrode 211 of the display element DE may be electrically connected to the connection electrode CML through a contact hole in the second planarization layer 116.

The pixel electrode 211 may include a conductive oxide such as indium tin oxide (ITO), indium zinc oxide (IZO), zinc oxide (ZnO), indium oxide ($In_2O_3$), indium gallium oxide (IGO), or aluminum zinc oxide (AZO). In another embodiment, the pixel electrode 211 may include a reflective film including Ag, Mg, Al, Pt, Pd, Au, Ni, Nd, Ir, Cr, or compounds thereof. In another embodiment, the pixel electrode 211 may further include a film including ITO, IZO, ZnO, or $In_2O_3$ on/under the aforementioned reflective film.

A pixel defining film 118 including an opening 118OP may be disposed on the pixel electrode 211, wherein the opening 118OP exposes a center portion of the pixel electrode 211. The pixel defining film 118 may include an organic insulating material and/or an inorganic insulating material. The opening 118OP may define an emission area EA of light emitted from the display element DE. For example, a width of the opening 118OP may correspond to a width of the emission area EA of the display element DE.

A spacer 119 may be disposed on the pixel defining film 118. In a method of manufacturing the display apparatus, the spacer 119 may be used for preventing breakage of the substrate 100. A mask sheet may be used in manufacturing of a display panel, and, in this case, the mask sheet may sag toward the opening 118OP of the pixel defining film 118 or may contact the pixel defining film, and thus, when a deposition material is deposited on the substrate 100, defects such as damage or failure to a portion of the substrate 100 may be generated by the mask sheet. The spacer 119 may prevent the portion of the substrate 100 from defects such as damage or failure while a deposition material is deposited on the substrate 100.

The spacer 119 may include an organic insulating material such as polyimide. Alternatively, the spacer 119 may include an inorganic insulating material such as $SiN_x$ or $SiO_2$, or may include an organic insulating material and an inorganic insulating material.

In an embodiment, the spacer 119 may include a material different from a material of the pixel defining film 118. Alternatively, in another embodiment, the spacer 119 may include a material identical to a material of the pixel defining film 118, and, in this case, the pixel defining film 118 and the spacer 119 may be formed together using a halftone mask and the like.

An intermediate layer 212 may be formed on the pixel defining film 118. The intermediate layer 212 may include an emission layer 212*b* arranged in the opening 118OP of the pixel defining film 118. The emission layer 212*b* may include a high-molecular or low-molecular organic material emitting light of certain colors.

A first function layer 212*a* and a second function layer 212*c* may be respectively arranged under and over the emission layer 212*b*. The first function layer 212*a* may include, for example, a hole transport layer (HTL), or may include an HTL and a hole injection layer (HIL). The second function layer 212*c* may include an optional component disposed on the emission layer 212*b*. The second function layer 212*c* may include an electron transport layer (ETL) and/or an electron injection layer (EIL). Like a counter electrode 213 to be described later, the first function layer 212*a* and/or the second function layer 212*c* may be a common layer formed to entirely cover the substrate 100.

The counter electrode 213 may include a conductive material having a small work function. For example, the counter electrode 213 may include a (semi) transparent layer including Ag, Mg, Al, Pt, Pd, Au, Ni, Nd, Ir, Cr, Li, Ca, or alloys thereof. Alternatively, the counter electrode 213 may further include a layer including ITO, IZO, ZnO, $In_2O_3$, or the like on the (semi) transparent including the aforementioned materials.

In some embodiments, a capping layer (not shown) may be further disposed on the counter electrode 213. The capping layer may include LiF, an inorganic material, and/or an organic material.

The encapsulation layer 300 may be disposed on the counter electrode 213. The encapsulation layer 300 may be disposed on the display element layer DEL and cover the display element layer DEL. The encapsulation layer 300 includes at least one inorganic encapsulation layer and at least one organic encapsulation layer, and, as an embodiment, FIG. 3 illustrates that the encapsulation layer 300 includes a first inorganic encapsulation layer 310, an organic encapsulation layer 320, and a second inorganic encapsulation layer 330 sequentially stacked.

The first inorganic encapsulation layer and the second inorganic encapsulation layer 330 may include one or more inorganic materials from among aluminum oxide, titanium oxide, tantalum oxide, hafnium oxide, zinc oxide, silicon oxide, silicon nitride, and silicon oxynitride. The organic encapsulation layer 320 may include a polymer-based material. The polymer-based material may include an acryl-based resin, an epoxy-based resin, polyimide, polyethylene, and the like. In an embodiment, the organic encapsulation layer 320 may include acrylate. The organic encapsulation layer 320 may be formed by curing a monomer or coating a polymer. The organic encapsulation layer 320 may have transparency.

Although not shown, a touch electrode layer may be disposed on the encapsulation layer, and the optical function layer OFL may be disposed on the touch electrode layer.

Figure 4:
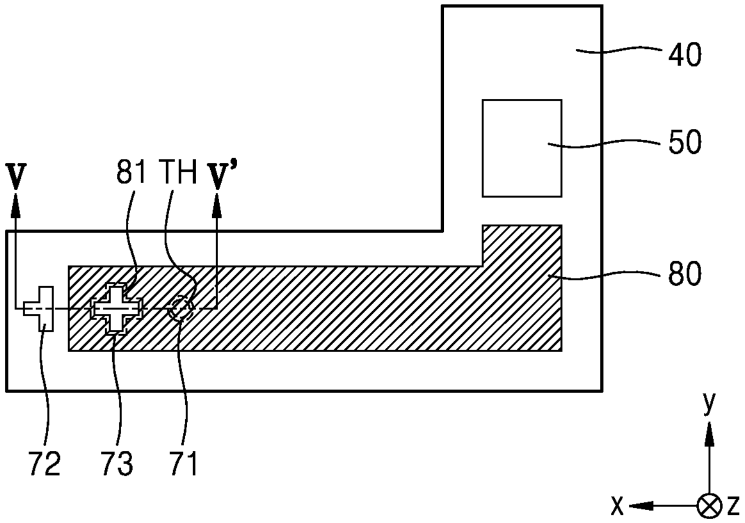
FIG. 4 is a plan view of a display circuit board according to an embodiment, which illustrates the display circuit board seen in a direction IV shown in FIG. 2.
Figure 5:
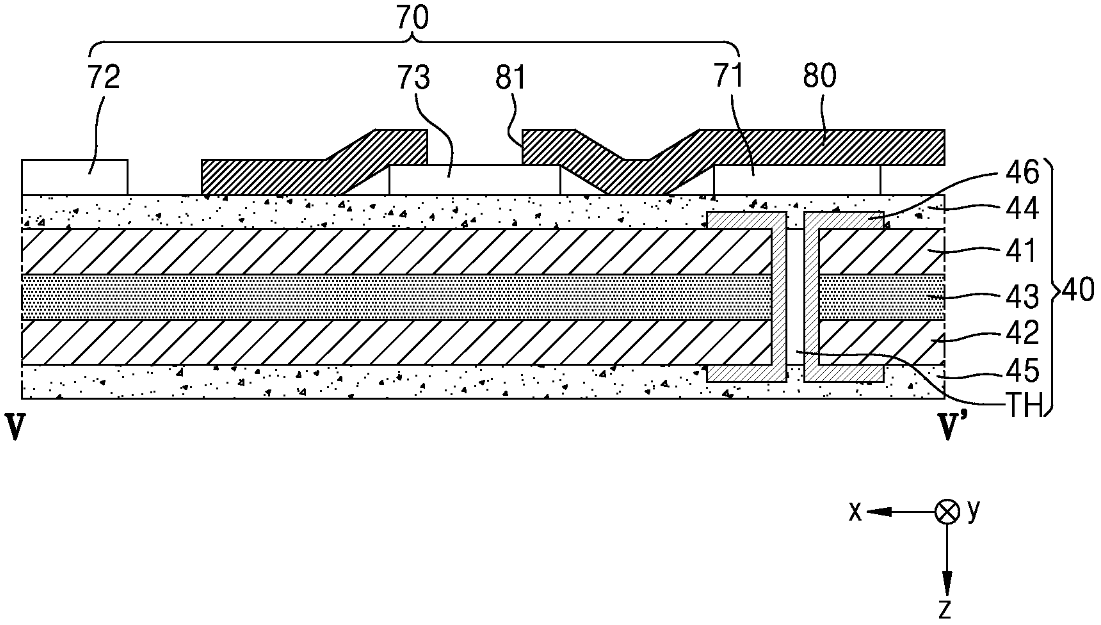
FIG. 5 is a cross-sectional view of a display circuit board according to an embodiment, which may correspond to a cross-section taken along a line V-V' shown in FIG. 4.

FIG. 4 is a top-plan view of the display circuit board 40 according to an embodiment, which illustrates the display circuit board 40 seen in a IV direction shown in FIG. 2. FIG. 5 is a cross-sectional view of the display circuit board 40 according to an embodiment, which may correspond to a cross-section taken along a line V-V' shown in FIG. 4.

Referring to FIGS. 4 and 5, the display circuit board 40 may be electrically connected to the display panel 10 and deliver a signal to the display panel 10. As described above, the display circuit board 40 may be connected to the pad area PDA of the substrate 100.

In an embodiment, the display circuit board 40 may include a film layer 43, a first conductive layer 41, a second conductive layer 42, a first insulating layer 44, a second insulating layer 45, and a conductor 46.

The first conductive layer 41 and the second conductive layer 42 may be respectively disposed on two surfaces of the film layer 43. The film layer 43 may prevent cracks in the first conductive layer 41 and the second conductive layer 42. The film layer 43 may include polyimide.

The first conductive layer 41 may be disposed on one surface, e.g., a top surface (a surface in the −z direction shown in FIG. 4), of the film layer 43. The second conductive layer 42 may be disposed on the other surface, e.g., a bottom surface (a surface in the +y direction shown in FIG. 4), of the film layer 43. The first conductive layer 41 and the second conductive layer 42 may each include a conductive material. For example, the first conductive layer 41 and the second conductive layer 42 may include copper (Cu).

In an embodiment, the display circuit board 40 may include a through hole TH for electrically connecting the first conductive layer 41 and the second conductive layer 42 through the conductor 46 formed on inside surface of the through hole TH. More particularly, the through hole TH may include an opening formed through the first conductive layer 41, the second conductive layer 42, and the film layer 43. An inner surface of the through hole TH may be covered by a conductor 46 such as a plating material. Accordingly, the conductor 46 may be electrically connected to the first conductive layer 41 at one side and to the second conductive layer 42 at another side, thereby connecting signals in the first conductive layer 41 and the second conductive layer 42. In addition, the through hole TH may be provided in a plurality.

The first insulating layer 44 and the second insulating layer 45 may respectively cover the first conductive layer 41 and the second conductive layer 42. The first insulating layer 44 may be disposed on one side of the first conductive layer 41 that is opposite to the film layer 43. The second conductive layer 45 may be disposed on one side of the second conductive layer 42 that is opposite to the film layer 43. The first insulating layer 44 and the second insulating layer 45 may maintain the rigidity of the display circuit board 40 and protect a circuit of the display circuit board 40. In an embodiment, the first insulating layer 44 and the second insulating layer 45 may be coated using ink or be insulating films attached to a surface of the first insulating layer 44 and a surface of the second insulating layer 45.

A marker 70 may be disposed on the display circuit board 40, more particularly, on the first insulating layer 44. In this case, the marker 70 may be formed through silk screen printing method, i.e., may be formed by squeezing silk ink. Although the marker 70 may be mainly arranged to provide particular information, the marker 70 may also be used as an alignment mark or to cover the through hole TH.

In an embodiment, the marker 70 may include a first marker 71, a second marker 72, and a third marker 73 arranged spaced apart from one another on the first insulating layer 44. The first marker 71 may be arranged to securely cover the through hole TH and may be disposed on the through hole TH. In a top-plan view, the first marker 71 may have an area greater than an area of the through hole TH to completely cover the through hole TH. Accordingly, the first marker 71 and the first insulating layer 44 may cover the through hole TH1, and may secure shielding for the through hole TH. In an embodiment, the first marker 71 may be arranged in an area of the display circuit board 40 covered by a shielding film 80 to be described later.

The second marker 72 may be disposed on the first insulating layer 44, and as described above, may be arranged in an area of the display circuit board 40 that is not covered by the shielding film 80. In an embodiment, the second marker 72 may form the alignment mark of the display circuit board 40. For example, the second marker 72 may have a shape the same as the mathematical sign '+' or a bar with a protrusion on one side of the bar, for example, ' F' or 'J' shape. That is, in a process of manufacturing the display apparatus 1, a position of the display circuit board 40 may be identified through the second marker 72 and use the position as a reference point for combination with other components. In other embodiments, the second marker 72 may include a character to indicate information such as a date of manufacturing a product.

The third marker 73 may be disposed on the first insulating layer 44, and like to be described below, may be arranged in an area of the display circuit board 40 covered by the shielding film 80. The third marker 73 may be covered by the shielding film 80 and provide certain information together with an opening pattern 81 of the shielding film 80. For example, the third marker 73 may be configured to provide, together with the opening pattern 81, an alignment mark of the display circuit board 40 or a character for indicating information such as a date of manufacturing a product.

The first marker 71, the second marker 72, and the third marker 73 may be disposed on a same layer, e.g., the first insulating layer 44. In an embodiment, the first marker 71, the second marker 72, and the third marker 73 may include a same material and may be formed at the same time.

The shielding film 80 may be disposed on the marker 70. In an embodiment, the shielding film 80 may include a silver (Ag) layer and may prevent electromagnetic interference (EMI). Furthermore, in an embodiment, the shielding film 80 may include an anisotropic conductive adhesion layer (not shown) and may be attached to the display circuit board 40 and the marker 70 through the anisotropic conductive adhesion layer.

In an embodiment, the shielding film 80 may be arranged to cover a portion of the display circuit board 40. In addition, the shielding film 80 may be arranged to cover at least one of a plurality of the markers 70. For example, as shown in FIG. 4, the shielding film 80 may be arranged to cover the first marker 71 and the third marker 73. Here, the shielding film 80 may be arranged to not cover the second marker 72.

In an embodiment, the shielding film 80 may include the opening pattern 81. The opening pattern 81 may include a through opening completely formed through the shielding film 80. In an embodiment, the opening pattern 81 may be arranged to overlap the third marker 73 on a top-plan view. That is, the third marker 73 may be exposed and recognized through the opening patter 81. In this case, the third marker 73 exposed by the opening pattern 81 may function as an alignment mark of the display circuit board 40. For example, the opening pattern 81 may have a shape like the mathematical sign '+' or a bar with a protrusion on one side of the bar, for example, ' F' or 'H' shape. Accordingly, through the opening pattern 81, the third marker 73 disposed under the opening pattern 81 may be recognized according to the shape of the opening pattern 81. On a top-plan view, the third marker 73 may be arranged to have an area greater than an area of the opening pattern 81 in a plan view a central portion of which may be partially exposed by the opening pattern 81. Because the opening pattern 81 decides the shape of the alignment mark, the shape of the third marker 73 may have any shape as long as opening pattern 81 does not expose an area other than the third marker 73.

In an embodiment, the shielding film 80 may include a black dye, and thus may be black. In this case, the third marker 73 may include a white dye, and thus may be white. In this way, the visibility of the third marker 73 exposed and recognized through the opening pattern 81 of the shielding film 80 may be improved.

Figure 6:
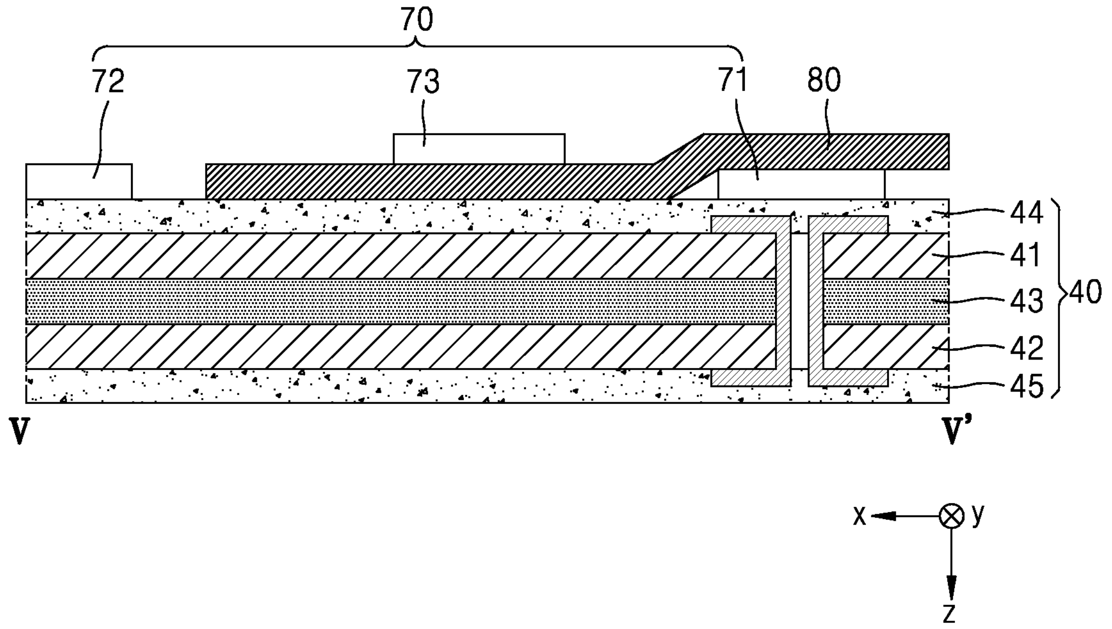
FIG. 6 is a cross-sectional view of a display circuit board according to the Comparative Example, which may be similar to FIG. 5.

FIG. 6 is a cross-sectional view of the display circuit board 40 according to the Comparative Example.

Referring to FIG. 6, the display circuit board 40 as the Comparative Example is shown. In the Comparative Example, the first marker 71 may be disposed on the display circuit board 40 to cover the through hole TH. The second marker 72 may be disposed on the display circuit board 40 when an alignment mark is needed on the display circuit board 40 or when certain information, e.g., information regarding a date of manufacturing a product, is to be indicated on the display circuit board 40. The shielding film 80 may be attached onto the display circuit board 40 to cover the first marker 71 and prevent electromagnetic interference. In this case, the alignment mark or indication of certain information may be provided on the shielding film 80 that has been attached, and the third marker 73 may be formed on the shielding film 80.

Accordingly, in the Comparative Example, after performing a process of forming the first marker 71 and the second marker 72 on the display circuit board 40, e.g., a silk screen printing process, a process of attaching the shielding film 80 is performed, and then a process of forming the third marker 73 on the shielding film 80, e.g., a silk screen printing process, is to be performed.

As described above, in the display apparatus 1 according to an embodiment, the first marker 71, the second marker 72, and the third marker 73 may be disposed as a same layer on the display circuit board 40, e.g., on the first insulating layer 44. In an embodiment, the first marker 71, the second marker 72, and the third marker 73 may include a same material and may be formed at the same time. The shielding film 80 may be arranged to cover at least a portion of the marker 70, and the third marker 73 may be exposed and recognized through the opening pattern 81 formed on the shielding film 80.

Accordingly, a process of manufacturing the display apparatus 1 may be further simplified. More particularly, the first marker 71, the second marker 72, and the third marker 73 may be formed together through a single process. Next, the shielding film 80 in which the opening pattern 81 is provided is disposed on the marker 70, and, by doing so, the process of manufacturing the display apparatus 1 may be simplified compared to the Comparative Example.

In addition, in the Comparative Example, the third marker 73 may be f an alignment mark or a character indicating particular information, and a printing tolerance may be about 0.2 mm. In an embodiment, the third marker 73 may not have the form of an alignment mark or a character for indicating particular information, and, instead, the opening pattern 81 may be open in the form of an alignment mark or a character indicating particular information. A cutting tolerance to form the opening pattern 81 in the shielding film may be about 0.1 mm. Accordingly, in the display apparatus 1 according to an embodiment, the accuracy of the alignment mark or a character indicating particular information may be improved compared with the Comparative Example. By doing so, a device for recognizing an alignment mark may more accurately recognize the alignment mark.

Figure 7:
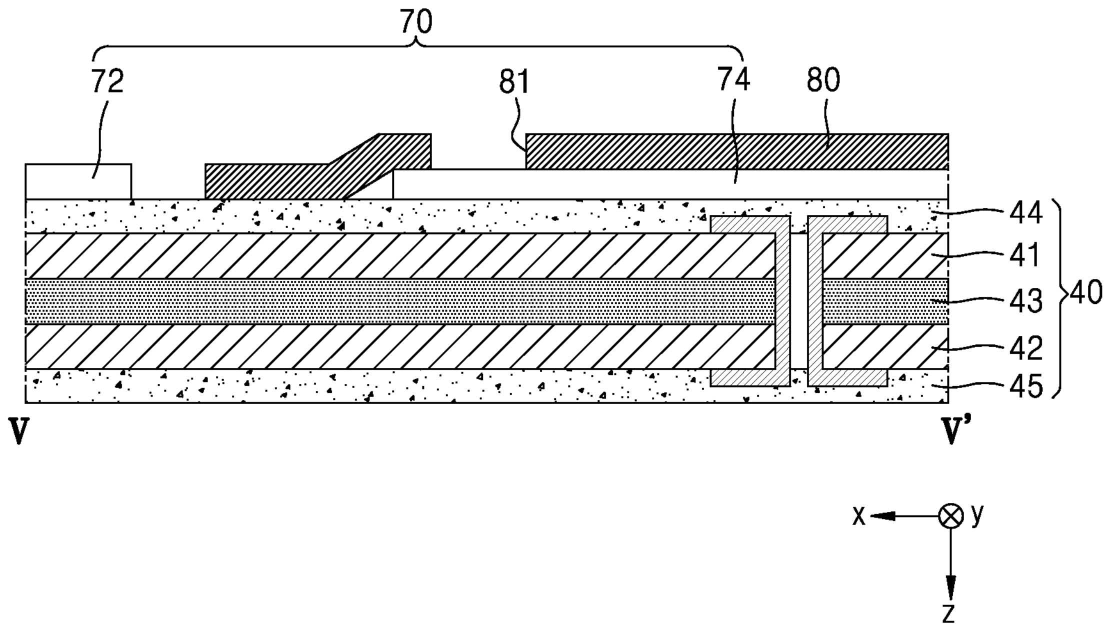
FIG. 7 is a cross-sectional view of a display circuit board according to another embodiment, which may be similar to FIG. 5.

FIG. 7 is a cross-sectional view of the display circuit board 40 according to another embodiment, which may be similar to FIG. 5. As the display circuit 40 according to the present embodiment is similar to the display circuit board 40 described above, only differences will be mainly described hereinafter.

Referring to FIG. 7, the marker 70 may be disposed on the display circuit board 40, e.g., on the first insulating layer 44. In an embodiment, the marker 70 may be formed through silk screen printing method, i.e., may be formed by squeezing silk ink. The shielding film 80 may be disposed to cover a portion of the marker 70.

In this case, the marker 70 may include the second marker 72 and a fourth marker 74. As described above, the second marker 72 may be arranged in an area of the display circuit board 40 in which the shielding film 80 is not arranged. The second marker 72 may be an alignment mark of the display circuit board 40 or a character for indicating particular information such as a date of manufacturing a product.

The fourth marker 74 may be arranged in an area of the display circuit board 40 covered by the shielding film 80. That is, the fourth marker 74 may be disposed under the shielding film 80. In an embodiment, the fourth marker 74 may be integrally formed under the shielding film 80 to cover the through hole TH and to be completely disposed under the opening pattern 81 in the shielding film 80. On a top-plan view, the fourth marker 74 may be formed in a size substantially identical to a size of the shielding film 80. In other words, the fourth marker 74 may include a marker in which the first marker 71 for covering the through hole TH and the third marker 73 configured to provide an alignment mark and/or particular information through the opening pattern 81 are integrally formed.

Similar to the embodiments described above, the shielding film 80 may include an opening pattern 81 exposing a portion of the fourth marker 74, and a portion of the fourth marker 74 may be exposed to be recognized through the opening pattern 81. Accordingly, a portion of the fourth marker 74, which is exposed by the opening pattern 81, may function as the alignment mark and/or provide particular information.

According to the embodiment, as the first marker 71 and the third marker 73 are integrally formed as one piece and is not necessarily separately formed, a process of manufacturing the display apparatus may be further simplified.

Figure 8:
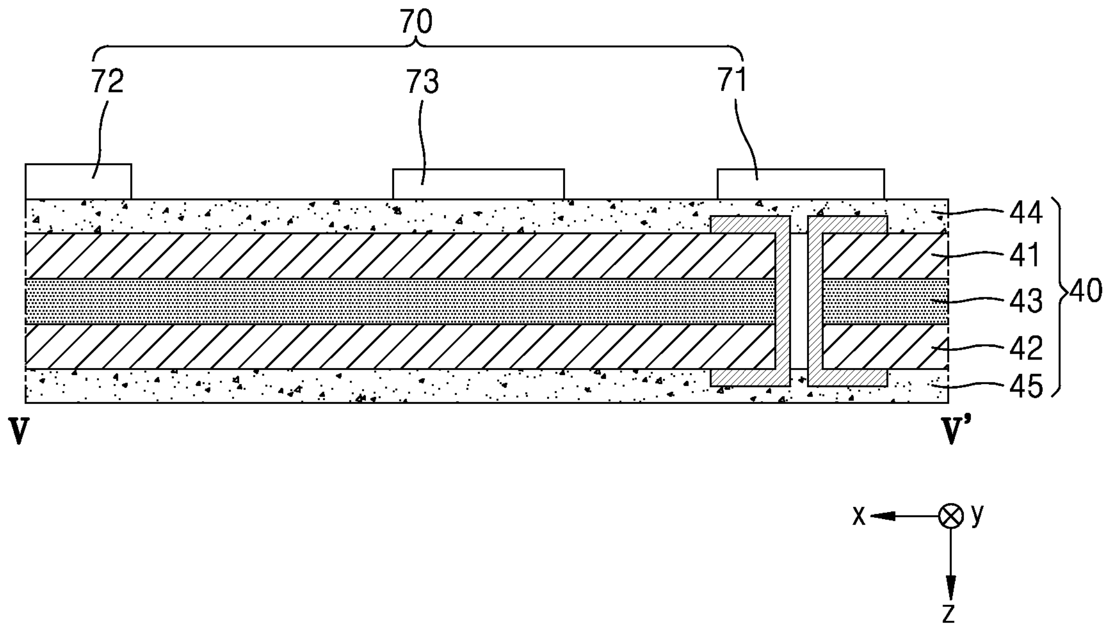
FIGS. 8 and 9 are diagrams illustrating a method of manufacturing a display apparatus according to an embodiment.
Figure 9:
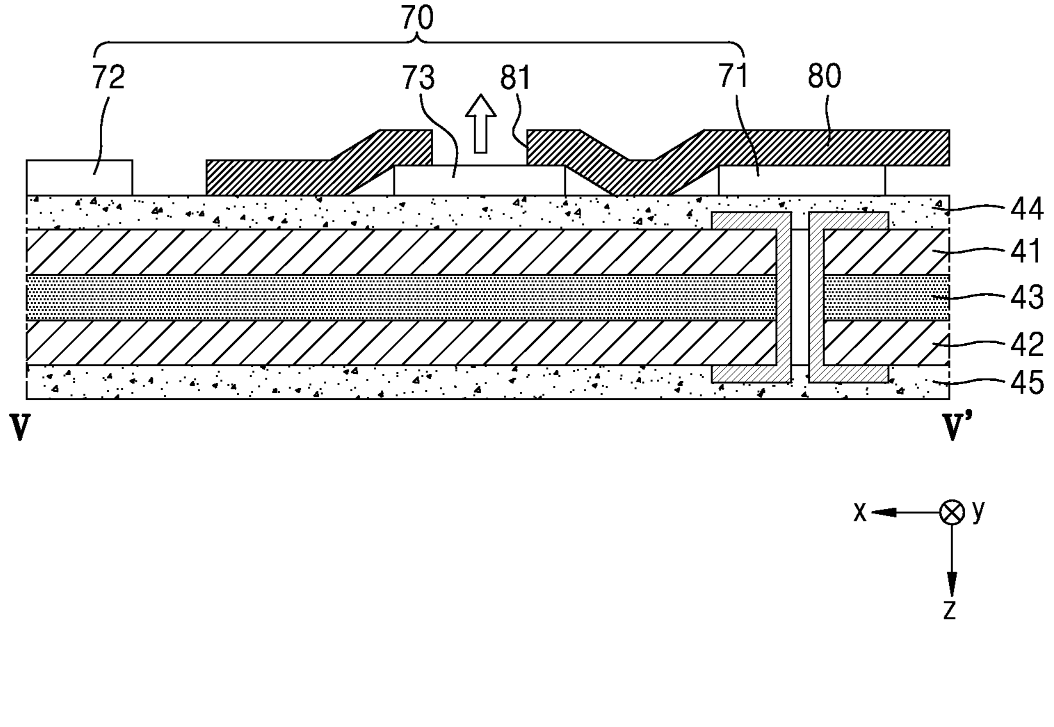

FIGS. 8 and 9 are diagrams illustrating a method of manufacturing the display apparatus 1 according to an embodiment. The method of manufacturing the display apparatus, according to the present embodiment, may be used for manufacturing the aforementioned display apparatus but is not limited thereto.

Referring to FIG. 8, the display circuit board 40 may be prepared. The marker 70, e.g., the first marker 71, the second marker 72, and the third marker 73 may be formed on the display circuit board 40. In this case, the marker 70 may be formed through a silk screen printing method, i.e., may be formed by squeezing silk ink.

In an embodiment, the first marker 71 may be arranged to cover at least one through hole TH formed in the display circuit board 40. The second marker 72 formed on the display circuit board 40 may be an alignment mark used for alignment of components or indicate particular information. The third marker 73 may be arranged to completely overlap the opening pattern 81 of the shielding film 80 to be arranged hereinafter.

Referring to FIG. 9, the shielding film 80 may be arranged to cover at least a portion of the marker 70 disposed the display circuit board 40. For example, the shielding film 80 may be arranged to cover the first marker 71 and the third marker 73. The opening pattern 81 may be formed in advance before attaching the shielding film 80 on the marker 70. The opening patter 81, which is an alignment mark for alignment of the display circuit board 40, may be an alignment mark or provide particular information. Being arranged to overlap the third marker 73 in a plan view, the opening pattern 81 may expose and make the third marker 73 visible. In this case, to improve the visibility, the shielding film 80 may include a black dye and the third marker 73 may include a white dye.

According to an embodiment, the first marker 71, a second marker 72, and the third marker 73 may be formed together on a same layer through a single process. Next, the shielding film 80 in which the opening pattern 81 is provided is formed on the marker 70, and, by doing so, the process of manufacturing the display apparatus 1 may be simplified.

According to embodiments, a display apparatus may be manufactured through simple processes, thus may shorten the process time and save production cost.

Advantageous effects of the embodiments are not limited to the aforementioned effects, and other unmentioned effects may be clearly understood based on the descriptions of the following claims.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display apparatus comprising:
- a display panel comprising a plurality of pixels; and
- a display circuit board attached to the display panel and configured to deliver signals to the display panel, the display circuit board comprising:
- a plurality of markers disposed on the display circuit board; and
- a shielding film arranged on the plurality of markers to cover at least one of the plurality of markers and comprising at least one opening pattern exposing the at least one of the plurality of markers in a plan view.

2. The display apparatus of claim 1, wherein the at least one of the plurality of markers exposed by the at least one opening pattern is visibly exposed through the at least one opening pattern.

3. The display device of claim 1, wherein the display circuit board comprises a film layer, a first conductive layer disposed on one surface of the film layer, and a second conductive layer disposed on the other surface of the film layer opposite to the one surface of the film layer, and wherein the first conductive layer and the second conductive layer are electrically connected to each other through a conductor arranged in a through hole formed through the first conductive layer, the second conductive layer, and the film layer.

4. The display apparatus of claim 3, wherein the plurality of markers comprise a first marker disposed on the through hole to cover the through hole in a plan view and covered by the shielding film.

5. The display apparatus of claim 4, wherein the first marker completely cover the through hole in a plan view.

6. The display apparatus of claim 4, wherein the plurality of markers further comprise a second marker which is not covered by the shielding film.

7. The display apparatus of claim 6, wherein the at least one of the plurality of markers exposed by the at least one opening pattern forms an alignment mark of the display circuit board.

8. The display apparatus of claim 6, wherein the plurality of markers further comprise a third marker arranged to completely overlap the opening pattern in a plan view.

9. The display apparatus of claim 8, wherein the first marker, the second marker, and the third marker are disposed on a same layer.

10. The display apparatus of claim 8, wherein the first marker, the second marker, and the third marker comprise a same material.

11. The display apparatus of claim 8, wherein the first marker and the third marker are integrally formed to be a single piece.

12. The display apparatus of claim 1, wherein the opening pattern has an alignment mark shape.

13. The display apparatus of claim 1, wherein the shielding film comprises a black dye and the at least one of the plurality of markers comprises a white dye.

14. A method of manufacturing a display apparatus, the method comprising:

preparing a display circuit board configured to deliver signals to a display panel;

forming a plurality of markers on the display circuit board;

preparing a shielding film having an opening pattern formed through the shielding film; and arranging the shielding film to cover at least one of the plurality of markers for the opening pattern to expose the at least one of the plurality of markers in a plan view.

15. The method of claim 14, wherein the plurality of markers are formed through a silk screen printing method.

16. The method of claim 14, wherein the opening pattern has an alignment mark shape.

17. The method of claim 14, wherein the display circuit board comprises a film layer, a first conductive layer disposed on one surface of the film layer, and a second conductive layer disposed on the other surface of the film layer opposite to the one surface of the film layer, and wherein the first conductive layer and the second conductive layer are electrically connected to each other through a conductor arranged in a through hole formed through the first conductive layer, the second conductive layer, and the film layer.

18. The method of claim 17, wherein the plurality of markers include a first marker disposed on the through hole to cover the through hole and covered by the shielding film.

19. The method of claim 18, wherein the first marker completely covers the through hole in a plan view.

20. The method of claim 14, wherein the shielding film comprises a black dye and the plurality of markers comprise a white dye.

* * * * *